US009570369B1

(12) United States Patent
Shih et al.

(10) Patent No.: US 9,570,369 B1

(45) Date of Patent: Feb. 14, 2017

(54) SEMICONDUCTOR PACKAGE WITH SIDEWALL-PROTECTED RDL INTERPOSER AND FABRICATION METHOD THEREOF

(71) Applicant: INOTERA MEMORIES, INC., Taoyuan (TW)

(72) Inventors: Shing-Yih Shih, New Taipei (TW); Tieh-Chiang Wu, Taoyuan (TW)

(73) Assignee: INOTERA MEMORIES, INC., Taoyuan (TW)

( * ) Notice: Subject to any disclaimer, the term of this patent is extended or adjusted under 35 U.S.C. 154(b) by 0 days.

(21) Appl. No.: 15/068,649

(22) Filed: Mar. 14, 2016

(51) Int. Cl.

| | |
|---|---|
| ***H01L 21/00*** | (2006.01) |
| ***H01L 23/31*** | (2006.01) |
| ***H01L 25/065*** | (2006.01) |
| ***H01L 25/00*** | (2006.01) |
| ***H01L 23/498*** | (2006.01) |
| ***H01L 21/56*** | (2006.01) |
| ***H01L 21/78*** | (2006.01) |

(52) U.S. Cl.

CPC ......... *H01L 23/3185* (2013.01); *H01L 21/561* (2013.01); *H01L 21/563* (2013.01); *H01L 21/568* (2013.01); *H01L 21/78* (2013.01); *H01L 23/49811* (2013.01); *H01L 23/49827* (2013.01); *H01L 25/0655* (2013.01); *H01L 25/50* (2013.01)

(58) Field of Classification Search

CPC ............ H01L 23/3185; H01L 23/49811; H01L 23/49827; H01L 25/0655; H01L 25/50; H01L 21/561; H01L 21/563; H01L 21/568; H01L 21/78

USPC .................................. 257/723, 677; 438/114

See application file for complete search history.

(56) References Cited

U.S. PATENT DOCUMENTS

2016/0240466 A1* 8/2016 Chen .................. H01L 23/3114

* cited by examiner

*Primary Examiner* — Tu-Tu Ho

(74) *Attorney, Agent, or Firm* — Winston Hsu; Scott Margo

(57) ABSTRACT

A semiconductor package includes a redistributed layer (RDL) interposer having a first side, a second side opposite to the first side, and a vertical sidewall extending between the first side and the second side; at least one semiconductor die mounted on the first side of the RDL interposer; a molding compound disposed on the first side and covering the at least one semiconductor die and the vertical sidewall of the RDL interposer; and a plurality of solder bumps or solder balls mounted on the second side.

5 Claims, 6 Drawing Sheets

SEMICONDUCTOR PACKAGE WITH SIDEWALL-PROTECTED RDL INTERPOSER AND FABRICATION METHOD THEREOF

BACKGROUND OF THE INVENTION

1. Field of the Invention

The present invention relates generally to the field of semiconductor packaging. More particularly, the present invention relates to a wafer level package (WLP) with a sidewall-protected redistributed layer (RDL) interposer and a method for manufacturing the same.

2. Description of the Prior Art

The semiconductor technologies are developing very fast, and especially semiconductor dies have a tendency toward miniaturization. However, the requirements for the functions of the semiconductor dies have an opposite tendency to variety. Namely, the semiconductor dies must have more I/O pads into a smaller area, so the density of the pins is raised quickly. It causes the packaging for the semiconductor dies to become more difficult.

The main purpose of the package structure is to protect the dies from outside damages. Furthermore, the heat generated by the dies must be diffused efficiently through the package structure to ensure the operation the dies.

As known in the art, wafer level package (WLP) packages the dies on a wafer before dividing the dies into respective dies. The WLP technology has some advantages, such as a shorter producing cycle time and lower cost. Fan-out wafer-level packaging (FOWLP) is a packaging process in which contacts of a semiconductor die are redistributed over a larger area through a redistribution layer (RDL) that is typically formed on a substrate such as a TSV interposer.

The RDL is typically defined by the addition of metal and dielectric layers onto the surface of the wafer to re-route the I/O layout into a looser pitch footprint. Such redistribution requires thin film polymers such as BCB, PI or other organic polymers and metallization such as Al or Cu to reroute the peripheral pads to an area array configuration.

The TSV interposer is costly because fabricating the interposer substrate with TSVs is a complex process. Thus, forming FOWLP products that includes an interposer having a TSV interposer may be undesirable for certain applications.

In wafer level packaging, the wafer and the dies mounted on the wafer are typically covered with a relatively thick layer of the molding compound. The thick layer of the molding compound results in increased warping of the packaging due to coefficient of thermal expansion (CTE) mismatch, and the thickness of the packaging. It is known that wafer warpage continues to be a concern.

Warpage can prevent successful assembly of a die-to-wafer stack because of the inability to maintain the coupling of the die and wafer. Warpage issue is serious especially in a large sized wafer, and has raised an obstacle to a wafer level semiconductor packaging process that requires fine-pitch RDL process. Therefore, there remains a need in the art for an improved method of manufacturing wafer level packages.

SUMMARY OF THE INVENTION

The present invention is directed to provide an improved semiconductor package and a fabrication method that is capable of alleviating post-molding warpage and preventing cracking of the RDL interposer.

In one aspect of the invention, a semiconductor package includes a redistributed layer (RDL) interposer having a first side, a second side opposite to the first side, and a vertical sidewall extending between the first side and the second side; at least one semiconductor die mounted on the first side of the RDL interposer; a molding compound disposed on the first side and covering the at least one semiconductor die and the vertical sidewall of the RDL interposer; and a plurality of solder bumps or solder balls mounted on the second side.

In another aspect of the invention, a method for fabricating a semiconductor package is disclosed. First, a redistributed layer (RDL) interposer is formed on a carrier. At least one semiconductor die is mounted on a first side of the RDL interposer. At least one cut trench is formed in the RDL interposer. The cut trench penetrates through the RDL interposer. The cut trench exposes a vertical sidewall of the RDL interposer. The semiconductor die is encapsulated with a molding compound on the first side. The molding compound fills into the cut trench and covers the vertical sidewall of the RDL interposer. The carrier is then removed to expose a second side of the RDL interposer. A plurality of solder bumps or solder balls is formed on the second side.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute apart of this specification. The drawings illustrate some of the embodiments and, together with the description, serve to explain their principles. In the drawings.

DETAILED DESCRIPTION

Figure 1:
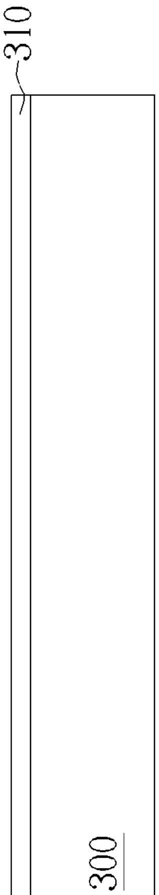
FIG. 1 to FIG. 11 are schematic diagrams showing an exemplary method for fabricating a semiconductor package with sidewall-protected RDL interposer according to one embodiment of the invention.

In the following detailed description of the invention, reference is made to the accompanying drawings, which form a part hereof, and in which is shown, by way of illustration, specific embodiments in which the invention may be practiced. These embodiments are described in sufficient detail to enable those skilled in the art to practice the invention. Other embodiments may be utilized and structural changes may be made without departing from the scope of the present invention.

The following detailed description is, therefore, not to be taken in a limiting sense, and the scope of the present invention is defined only by the appended claims, along with the full scope of equivalents to which such claims are entitled.

One or more implementations of the present invention will now be described with reference to the attached drawings, wherein like reference numerals are used to refer to like elements throughout, and wherein the illustrated structures are not necessarily drawn to scale. The terms "die", "semiconductor chip", and "semiconductor die" are used interchangeable throughout the specification.

The terms wafer and substrate used herein include any structure having an exposed surface onto which a layer is deposited according to the present invention, for example, to form the circuit structure such as a redistribution layer (RDL). The term substrate is understood to include semiconductor wafers, but not limited thereto. The term substrate is also used to refer to semiconductor structures during processing, and may include other layers that have been fabricated thereupon.

Please refer to FIG. 1 to FIG. 11. FIG. 1 to FIG. 11 are schematic diagrams showing an exemplary method for fabricating a semiconductor package with an encapsulated redistributed layer (RDL) interposer according to one embodiment of the invention.

As shown in FIG. 1, a carrier 300 is prepared. The carrier 300 may be a releasable substrate material with an adhesive layer (not explicitly shown). For example, the carrier 300 may be a silicon wafer or a glass wafer, but is not limited thereto. At least a dielectric layer or a passivation layer 310 is then formed on a top surface of the carrier 300. The passivation layer 310 may comprise organic materials such as polyimide (PI) or inorganic materials such as silicon nitride, silicon oxide or the like.

Figure 2:
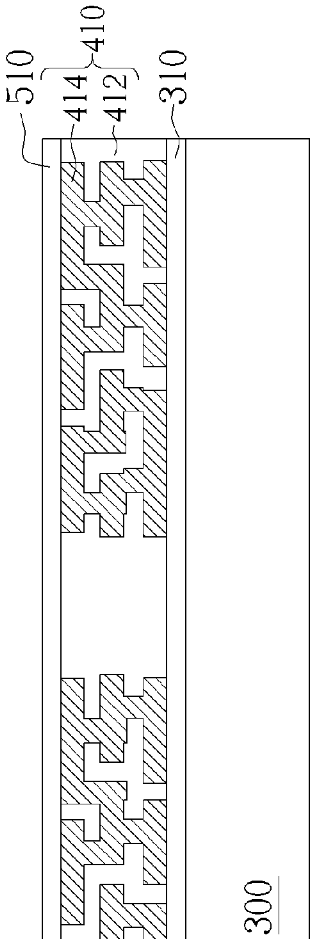

Subsequently, as shown in FIG. 2, a redistribution layer (RDL) layer 410 is formed on the passivation layer 310. The RDL layer 410 may comprise at least one dielectric layer 412 and at least one metal layer 414. The dielectric layer 412 may comprise organic materials such as polyimide (PI) or inorganic materials such as silicon nitride, silicon oxide or the like, but not limited thereto. The metal layer 414 may comprise aluminum, copper, tungsten, titanium, titanium nitride, or the like.

According to the illustrated embodiment, the metal layer 414 may comprise a plurality of bump pads 415 exposed from a top surface of the dielectric layer 412. A passivation layer (or a dielectric layer) 510 is formed on the RDL layer 410. It is understood that the passivation layer 510 may comprise a solder mask, but is not limited thereto.

Figure 3:
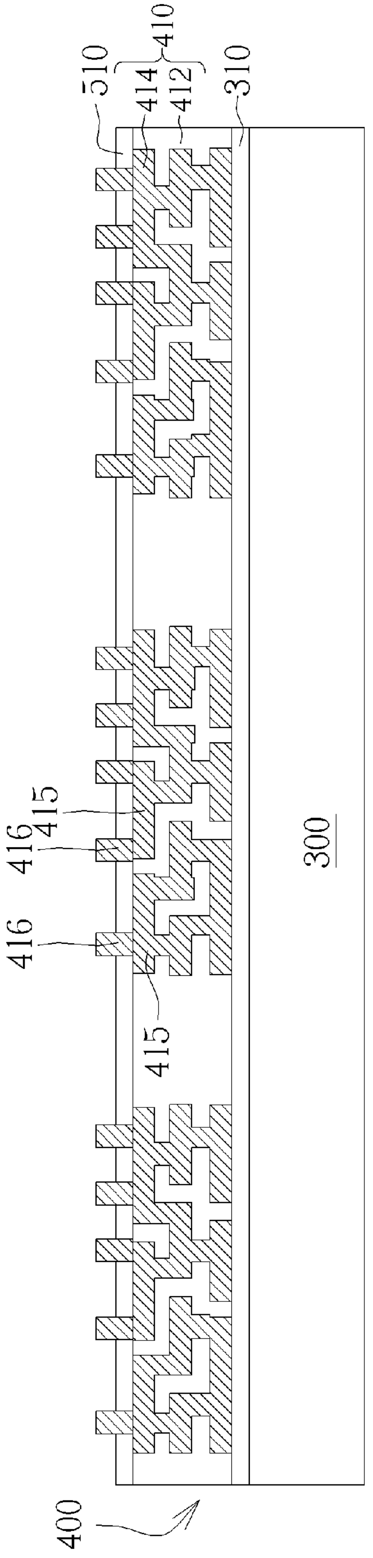

As shown in FIG. 3, a plurality of bumps 416 such as micro-bumps may be formed on the RDL layer 410 for further connections. The bumps 416 may be directly formed on respective bump pads 415 in the metal layer 414.

The formation of the bumps 416 is known in the art. For example, openings may be formed in the passivation layer 510 to expose the respective bump pads 415. Optionally, an under-bump metallurgy (UBM) layer may be deposited. Thereafter, a photoresist layer defining the pattern of the bumps 416 is formed and a plating process may be carried out to form a metal bump on the UBM layer. After removing the photoresist layer, the UBM layer not covered by the metal bump is removed.

According to the embodiment, the bumps 416 may comprise copper, but is not limited thereto. In some embodiments, the bumps 416 may be solder bumps and need to be ref lowed in a later stage. Hereinafter, the passivation layer 310, the RDL layer 410 and the passivation layer 510 are collectively referred to as an RDL interposer 400.

Figure 4:
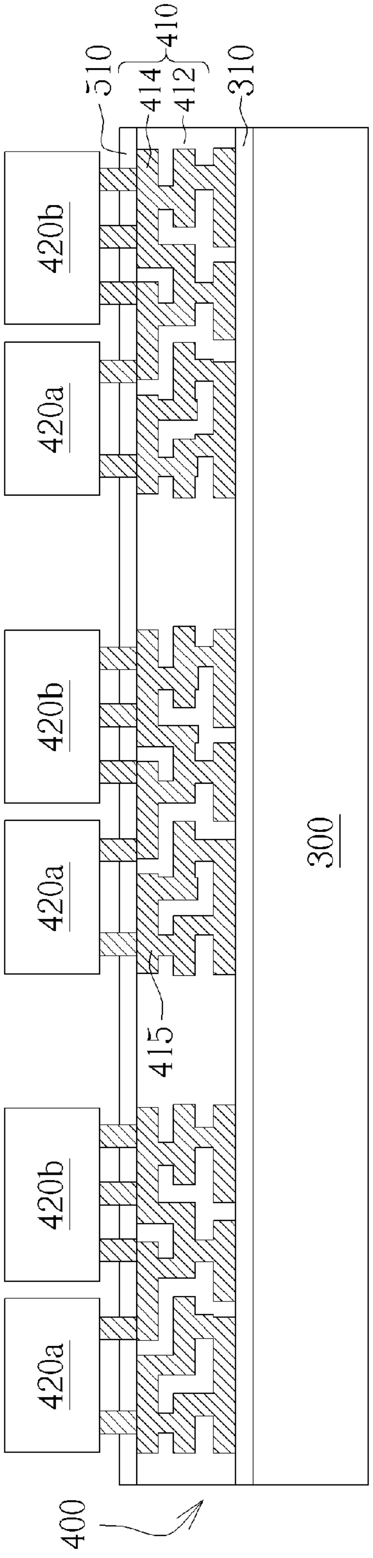

As shown in FIG. 4, after the formation of the bumps 416, individual flip-chips or dies 420*a* and 420*b* with their active sides facing down toward the RDL interposer 400 are then mounted on the RDL interposer 400 through the bumps 416 to thereby forming a stacked chip-to-wafer (C2 W) construction.

These individual flip-chips or dies 420*a* and 420*b* are active integrated circuit chips with certain functions, for example, GPU (graphic processing unit), CPU (central processing unit), memory chips, etc. According to the embodiment, the die 420*a* and the die 420*b* may be together disposed in one package and may be different chips with their specific functions.

Optionally, an underfill (not shown) may be applied under each die 420*a* or 420*b*. Optionally, a thermal process may be performed to reflow the bumps 416.

Figure 5:
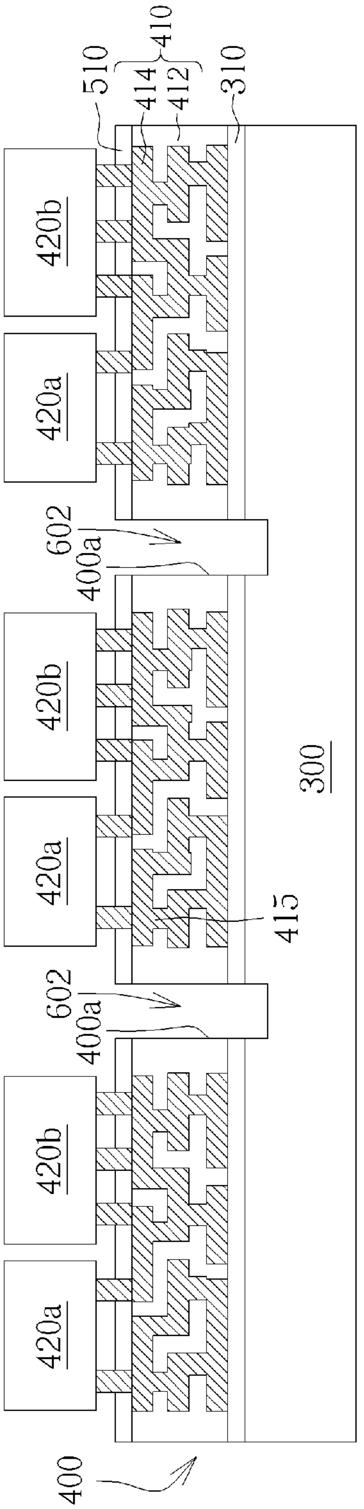

As shown in FIG. 5, a sawing or cutting process is performed to form cut trenches 602 penetrating through the RDL interposer 400, and extending slightly into the carrier 300 along the wafer dicing lines (or saw streets). The cut trench 602 does not penetrate through the entire thickness of the carrier 300.

At this point, a vertical sidewall 400*a* of the RDL interposer 400 is exposed within each of the cut trenches 602. According to the embodiment, the cut trenches 602 may be formed by using a dicing blade or a laser, but is not limited thereto.

Figure 6:
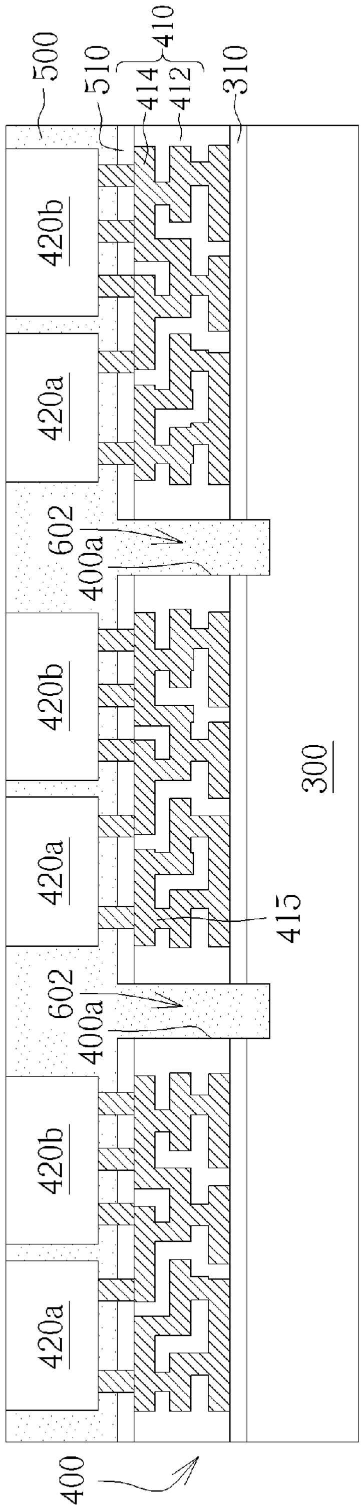

As shown in FIG. 6, a molding compound 500 is applied. The molding compound 500 covers the attached dies 420*a* and dies 420*b*, and the top surface of the passivation layer 510. The molding compound 500 also covers the vertical sidewall 400*a* of the RDL interposer 400. According to the embodiment, the cut trenches 602 may be completely filled up with the molding compound 500.

Subsequently, the molding compound 500 may be subjected to a curing process. According to the embodiment, the mold compound 500 may comprise a mixture of epoxy and silica fillers, but not limited thereto. Optionally, an upper portion of the molding compound 500 may be polished away to expose top surfaces of the dies 420*a* and the dies 420*b*.

Figure 7:
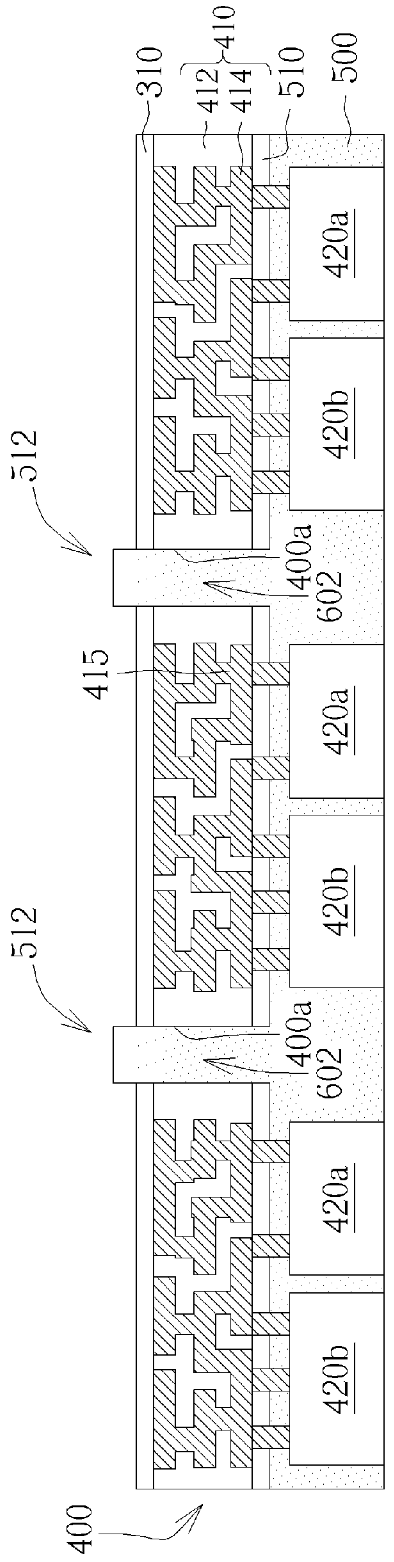

As shown in FIG. 7, the carrier 300 is removed or peeled off to expose a lower surface of the passivation layer 310. The de-bonding of the carrier 300 may be performed by using a laser process or UV irradiation process, but not limited thereto. At this point, protrudent features 512 may be formed.

Figure 8:
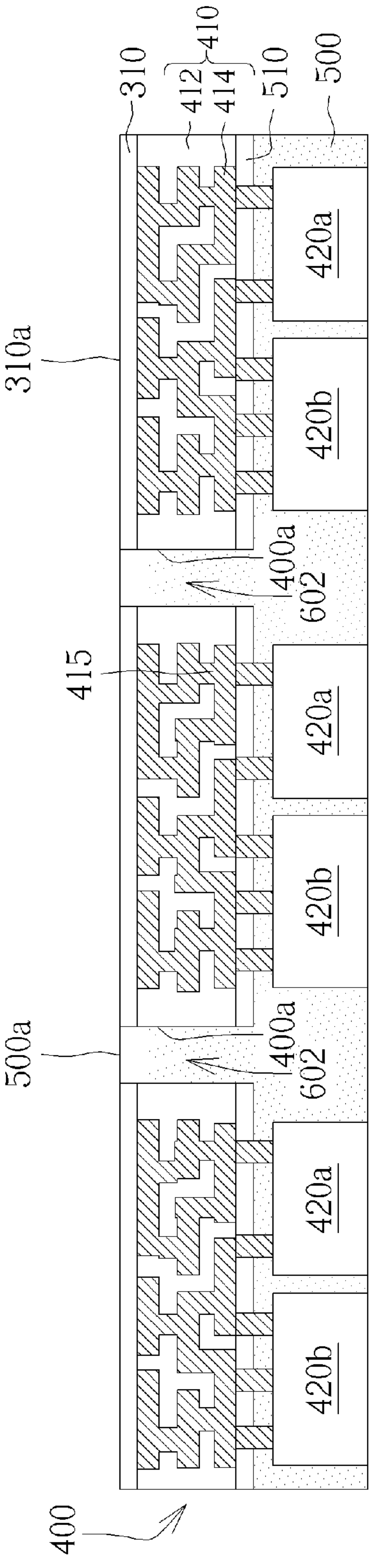

As shown in FIG. 8, a planarization process including, but not limited to, a chemical mechanical polishing (CMP) process, may be performed to remove the protrudent features 512. However, it is understood that the protrudent features 512 may be removed by other methods, for example, etching. At this point, the molding compound 500 has a surface 500*a* that is flush with a surface 310*a* of the passivation layer 310.

Figure 9:
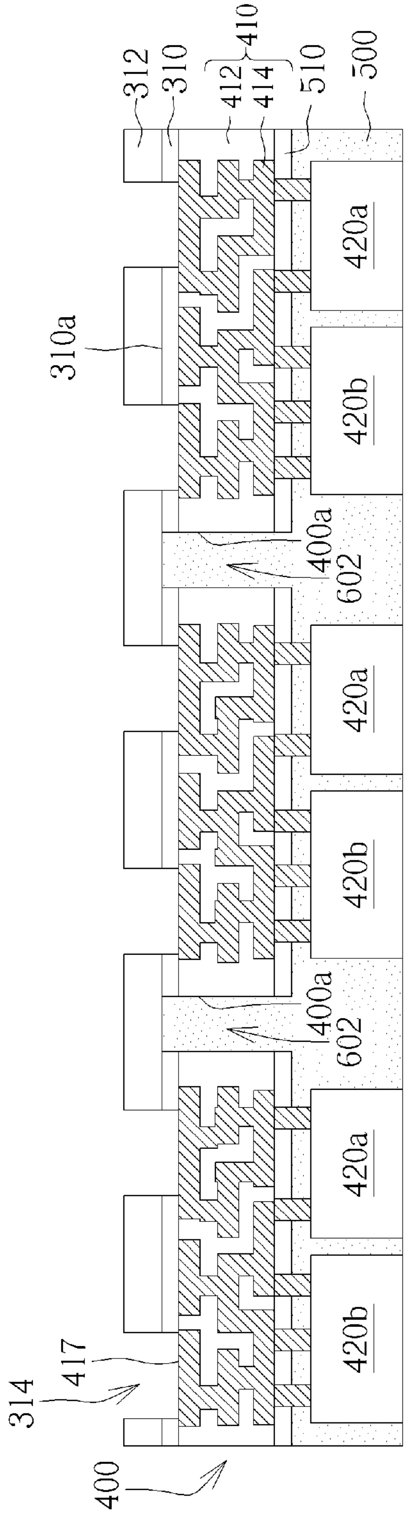

As shown in FIG. 9, a solder mask 312 may be formed on the passivation layer 310. A photographic process may be performed to form openings 314 in the solder mask 312 and the passivation layer 310 to expose respective solder pads (or ball pads) 417 in the metal layer 414 of the RDL layer 410.

Figure 10:
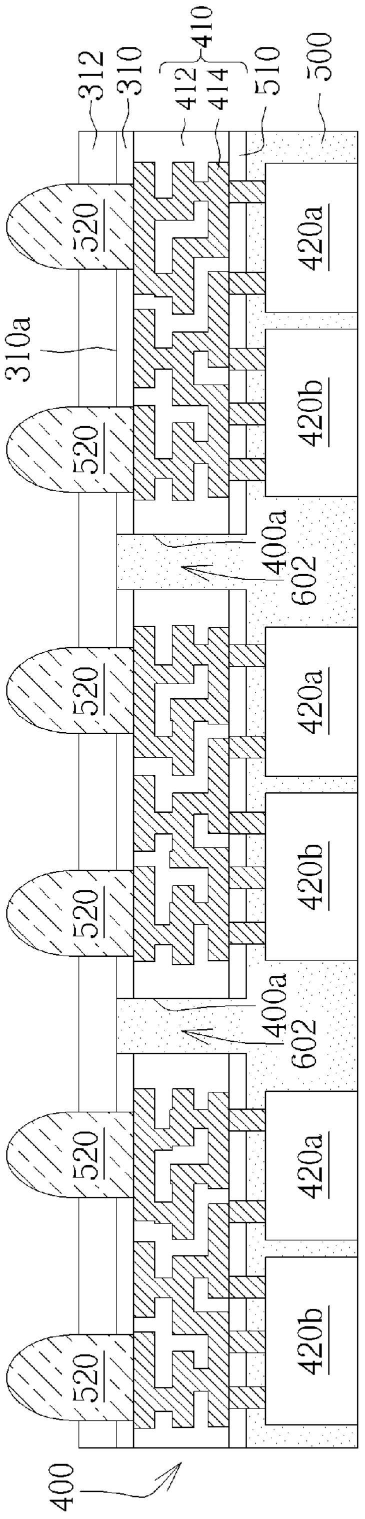

As shown in FIG. 10, solder bumps or solder balls 520 are formed on the respective solder pads 417. Although not explicitly shown in the figures, it is understood that the solder bumps or solder balls 520 may be formed on a UBM layer. The formation of the solder bumps or solder balls 520 are well-known in the art and therefore those details are omitted herein in the interest of brevity. For example, the solder bumps or solder balls 520 may be formed by plating, screen-printing, ball drop methods, or any suitable methods known in the art.

Figure 11:
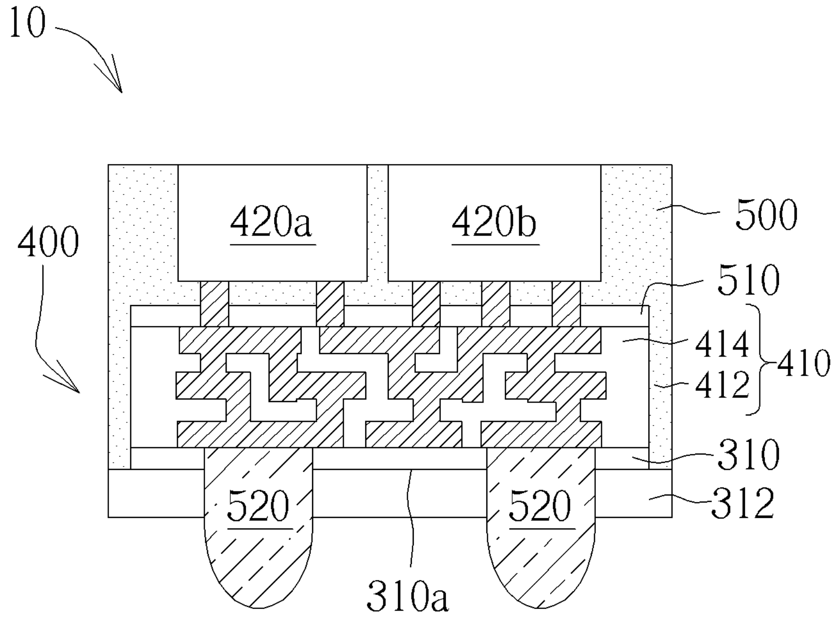

As shown in FIG. 11, a wafer dicing process is then performed to separate individual wafer level packages 10 from one another. It is understood that in some embodiment each wafer level package 10 may contain single die. It is one structural feature that the molding compound 500 is in direct contact with the vertical sidewall 400*a* of the RDL interposer 400. It is advantageous to use the present invention as described above because the vertical sidewall 400*a* of the RDL interposer 400 is protected by the molding compound 500. Therefore, the cracking or delamination of the RDL interposer 400 may be effectively avoided. The molding compound 500 is in direct contact with the solder mask 312. The molding compound 500 does not cover the sidewalls of the solder mask 312.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating a semiconductor package, comprising:

providing a carrier;

forming a redistributed layer (RDL) interposer on the carrier;

mounting at least one semiconductor die on a first side of the RDL interposer;

cutting at least one cut trench penetrating through the RDL interposer, wherein the cut trench exposes a vertical sidewall of the RDL interposer;

molding the semiconductor die with a molding compound on the first side, wherein the molding compound fills into the cut trench and covers the vertical sidewall of the RDL interposer;

removing the carrier to expose a second side of the RDL interposer; and forming a plurality of solder bumps or solder balls on the second side.

2. The method for fabricating a semiconductor package according to claim 1, wherein the cut trench is cut along a dicing line.

3. The method for fabricating a semiconductor package according to claim 1, wherein after removing the carrier, at least one protrudent feature is formed, wherein the protrudent feature protrudes from a surface on the second side.

4. The method for fabricating a semiconductor package according to claim 3 further comprising:

performing a planarization process to remove the protrudent feature.

5. The method for fabricating a semiconductor package according to claim 1 further comprising:

performing a wafer dicing process to separate individual semiconductor packages from one another.

* * * * *